(12) United States Patent
Ernsberger et al.

(10) Patent No.: US 6,897,761 B2
(45) Date of Patent: May 24, 2005

(54) BALL GRID ARRAY RESISTOR NETWORK

(75) Inventors: Craig Ernsberger, Granger, IN (US); Jason B. Langhorn, South Bend, IN (US); Yinggang Tu, Elkhart, IN (US)

(73) Assignee: CTS Corporation, Elkhart, IN (US)

( * ) Notice: Subject to any disclaimer, the term of this patent is extended or adjusted under 35 U.S.C. 154(b) by 53 days.

(21) Appl. No.: 10/309,704

(22) Filed: Dec. 4, 2002

(65) Prior Publication Data

US 2004/0108937 A1 Jun. 10, 2004

(51) Int. Cl.$^7$ .............................................. H01C 1/012
(52) U.S. Cl. ............................ 338/309; 338/60; 338/61
(58) Field of Search ............................ 338/309, 60, 61

(56) References Cited

U.S. PATENT DOCUMENTS

| | | | |
|---|---|---|---|
| 3,647,533 A | 3/1972 | Hicks | |
| 3,849,757 A | 11/1974 | Khammous | |
| 4,655,965 A | 4/1987 | Kuo | |
| 5,220,489 A | 6/1993 | Barreto | |
| 5,243,320 A | 9/1993 | Clouser | |
| 5,367,284 A | 11/1994 | Morris | |
| 5,485,138 A | 1/1996 | Morris | |
| 5,586,006 A | 12/1996 | Seyama | |
| 5,729,438 A | 3/1998 | Pieper | |
| 5,912,507 A | 6/1999 | Dunn | |
| 5,945,905 A * | 8/1999 | Mazzochette | ................ 338/51 |
| 5,977,863 A | 11/1999 | Bloom | |
| 6,005,777 A | 12/1999 | Bloom | |
| 6,097,277 A | 8/2000 | Ginn | |
| 6,100,596 A | 8/2000 | Daly | |
| 6,108,212 A | 8/2000 | Lach | |
| 6,124,634 A | 9/2000 | Akram | |
| 6,194,979 B1 | 2/2001 | Bloom | |
| 6,246,312 B1 | 6/2001 | Poole | |
| 6,281,090 B1 | 8/2001 | Kukanskis | |
| 6,285,542 B1 * | 9/2001 | Kennedy et al. | ............ 361/328 |
| 6,317,023 B1 | 11/2001 | Felten | |
| 6,326,677 B1 | 12/2001 | Bloom | |
| 6,631,551 B1 | 10/2003 | Bowles et al. | |
| 2002/0050400 A1 | 5/2002 | Kusner | |
| 2002/0075131 A1 | 6/2002 | Coates | |
| 2002/0108778 A1 * | 8/2002 | Dishongh et al. | ............ 174/261 |
| 2002/0118094 A1 * | 8/2002 | Kambara et al. | ............ 338/309 |
| 2002/0179329 A1 | 12/2002 | Fukuoka et al. | |
| 2003/0154592 A1 | 8/2003 | Felten | |
| 2004/0037058 A1 * | 2/2004 | Ernsberger et al. | ......... 361/763 |

FOREIGN PATENT DOCUMENTS

| | | |
|---|---|---|
| JP | 2-153589 | 6/1990 |
| JP | 5048258 | 2/1993 |
| JP | 7297555 | 11/1995 |
| JP | 8264929 | 10/1996 |
| JP | 2001-168491 | 12/1999 |
| JP | 2000-77218 | * 12/2001 |
| JP | 2003-92460 | 5/2002 |
| WO | WO97/30461 | 8/1997 |

OTHER PUBLICATIONS

Ohmega Technologies, Inc. Sep. 12, 2002 www.ohmega.com.

(Continued)

*Primary Examiner*—Karl D. Easthom
(74) *Attorney, Agent, or Firm*—Mark P. Bourgeois

(57) ABSTRACT

A ball grid array resistor network has a planar substrate formed of an organic material. The substrate preferably is a printed circuit board. The substrate has a top and bottom surface. A ball pad is located on the bottom surface. A low temperature resistor is located on the bottom surface and is connected to the ball pad. A solder mask is located over the first surface except for the ball pads. A conductive ball is attached to the ball pad. A reflowed solder paste connects the conductive ball to the ball pad. Several embodiments of the invention are shown.

4 Claims, 10 Drawing Sheets

OTHER PUBLICATIONS

Gould Electronics Inc.—TCR Copper Foil Sep. 12, 2002 WWW.gouldelectronics.com/tcr.num.

MacDermid Printed Cirduit Processing Technologies Sep. 12, 2002 www.macprintedcircuits.com/advanced/.

John Felten and Saul Ferguson, Embedded Ceramic Resistors and Capacitors for PWB, IP Printed Circuit Expo, San Diego, CA, Apr. 2000.

John J. Felten and Saul Ferguson, Ceramic Resistors and Capacitors Embedded in PWB, IPC, San Diego, Apr. 5, 2000.

John J. Felten and Saul Ferguson, Ceramic Resistors and Capacitors Embedded in PWB, IMAPS, Denver, Apr. 29, 2000.

John J. Felten and William J. Borland, Embedded Ceramic Passives in PWB: Process Development, IPC Printed Circuit Expo, Anaheim, CA, Apr. 2001.

John J. Felten and William J. Borland, Ceramic Resistors and Capacitors Embedded in PWB's, IPC Expo, Apr. 3, 2001.

William Borland, Designing for Embedded Passives, Printed Circuit Design, Aug. 2001.

William Borland, John J. Felten, Thick Film Ceramic Capacitors and Resistors inside Printed Circuit Boards, 34th International Symposium on Microelectronics (IMAPS), Oct. 9–11th, 2001, Baltimore, MD.

John Felten, Richard Snogren, Jiming Zhou, Embedded Ceramic Resistors and Capacitors in PWB: Process and Performance, Fall IPC Meeting, Oct. 11, 2001, Orlando, FL.

William J. Borland and Saul Ferguson, Embedded Passive Components in Printed Wiring Boards, a Technology Review, To be published in CircuiTree Magazine, 2001.

Jiming Zhou, John D. Myers and John J. Felten, Embedded Passives Technology for PCBs: Materials, Design, and Process, IMAPS 2002 Conference, Denver, CO, Sep. 4–6, 2002.

John J. Felten, Electronic Circuits World Convention, Paper No. IPC31, Advanced Embedded Passives Technologies—Putting Ceramic Components into Organic PWBs, no date.

William Borland, John J. Felten, Saul Ferguson, Alton B. Jones and Angela A. Lawrence, Embedded Singulated Ceramic Passives in Printed Wiring Boards, IMAPS Advanced Technology Workshop on Passive Integration, Ogunquit, ME, Jun. 19–21, 2002.

William Borland and John J. Felten, Integration of Ceramic Passives in Printed Wiring Board Substrates, DuPont Microcircuit Materials, no date.

William Borland, John J. Felten, Lynne E. Dellis, Saul Ferguson, Diptarka Majumdar, Alton B. Jones, Mark S. Lux, Richard R. Traylor and Marc Doyle, Ceramic Resistors and Capacitors Embedded in Organic Printed Wiring Boards, InterPack2003–35090, Proceedings of IPACK03, International Electronics Packaging Technical Conference and Exhibition, Jul. 6–11, 2003, Maui, Hawaii, USA, pp. 1–6.

David S. Hollander, The Mystique Behind Miniaturization—Surface Mount Technology, QST, Oct. 1987, pp 15–18.

Bryan P. Bergeron, A Surface–Mount Technology Primer–Part 2, QST, Jan. 1991, pp 27–30.

* cited by examiner

BALL GRID ARRAY RESISTOR NETWORK

BACKGROUND OF THE INVENTION

1. Field of the Invention

This invention pertains generally to resistor networks for terminating transmission lines and electronic devices and more specifically to a resistor network that is formed on an organic substrate.

2. Description of the Related Art

Transmission lines are used in a diverse array of electronic equipment to accommodate transmission of electrical or electronic signals. These signals may have a diverse set of characteristics, which might, for example, include direct or alternating currents, analog or digitally encoded content, and modulation of any of a diverse variety of types. Regardless of the characteristics of the signal, an ideal transmission line will conduct the signal from source to destination without altering or distorting the signal. Distance is inconsequential to this ideal transmission line, other than delays which might be characteristic of the transmission medium and the distance to be traversed.

At low frequencies and with direct current transmissions, many transmission lines perform as though they are nearly ideal, even over very great distances. Unfortunately, as the frequency of the signal increases, or as the frequency of component signals that act as a composite increases, the characteristics of most common transmission lines decay and signal transmission progressively worsens. This is particularly true when signals reach the radio frequency range or when transmission lines become longer. One common phenomenon associated with high frequency, long distance transmission lines is a loss of the signal's high frequency components and the introduction of extraneously induced interfering high frequency signals. Another common phenomenon is echo or line resonance, where a signal may be reflected from one end of the transmission line back to the other. In the case of a digital pulse, the effect will lead to corrupted data, since additional pulses may be received that were not part of the original transmission, and reflected pulses may cancel subsequent pulses.

To prevent echo within a transmission line, it is possible to terminate the line with a device which is referred to in the art as an energy dissipating termination. The termination must have an impedance which is designed to match the characteristic impedance of the transmission line as closely as possible over as many frequencies of interest as possible. Transmission lines generally have an impedance which is based upon the inductance of the conductor wire, capacitance with other signal lines and ground planes or grounding shields, and resistance intrinsic in the wire. With an appropriate transmission line, the sum of the individual impedance components is constant and described as the "characteristic impedance." To match the transmission line characteristic impedance over a wide frequency range, a termination must also address each of the individual impedance components. The effect of inductance is to increase impedance with increasing frequency, while capacitance decreases impedance with increasing frequency. Intrinsic resistance is independent of frequency.

In the particular field of data processing, transmission lines typically take the form of busses, which are large numbers of parallel transmission lines along which data may be transmitted. For example, an eight bit data bus will contain at least eight signal transmission lines that interconnect various components within the data processing unit. The data bus is actually a transmission line having to accommodate, with today's processor speeds, frequencies which are in the upper radio frequency band approaching microwave frequencies. These high frequency busses are, in particular, very susceptible to inappropriate termination and transmission line echo.

Terminations used for these more specific applications such as the data processor bus serve several purposes. A first purpose is to reduce echoes on the bus by resistively dissipating any signals transmitted along the bus. This first purpose is found in essentially all termination applications. A second purpose, more specific to data busses or other similar electronic circuitry, is to function as what is referred to in the art as a "pull-up" or "pull-down" resistor. The termination resistor will frequently be connected directly to either a positive power supply line or positive power supply plane, in which case the termination resistor is a "pull-up" resistor, or the resistor may be connected to either a negative or ground line or plane, in which case the resistor is referred to as a "pull-down" resistor. When no signal is present on the line, the voltage on the transmission line will be determined by the connection of the termination resistor to either a power supply line or a ground or common line. Circuit designers can then work from this predetermined bus voltage to design faster, more power-efficient components and circuits.

The prior art has attempted to address signal line termination in a number of ways which were suitable at lower operating speeds and frequencies, but which have not proven fully desirable as frequencies and components thereof increase.

One of several processes may be used to fabricate resistors. One such process is referred to as thin film, which might include vapor deposition techniques, sputtering, semi-conductor wafer type processing, and other similar techniques. An example of a thin film component is found in U.S. Pat. No. 5,216,404 to Nagai et al.

Another process is to use thick film components, herein considered to be components that are formed from a layer of semi-conductive metal oxide, cermet or a dielectric material deposited upon a non-conductive substrate, are most commonly formed from screen printing techniques. For the purposes of this application, thick films are defined as films formed when specially formulated pastes or inks are applied and fired or sintered onto a substrate at a high temperature of around 900 degrees Centigrade in a definite pattern and sequence to produce a set of individual components, such as resistors and capacitors, or a complete functional circuit. The substrates can be either pre-fired or can be in a green un-fired state. The pastes are usually applied using a screen printing method and may typically have a thickness of from 0.2 to 1 mil or more, and are well known in the industry. Cermet materials are materials comprising ceramic or glass in combination with metal compositions, where the first three letters: CER & MET make the word CERMET.

TCR stands for Temperature Coefficient of Resistance, which is a measure of the amount of change in resistance over some temperature range. Sheet resistance for the purposes of this disclosure is measured in the units of ohms per square. This will be considered herein to be the resistance of a film of equal length and width.

Low TCR thick film resistors may be readily manufactured that are both durable and have excellent TCR. These resistors may have sheet resistances that vary from fractions of an Ohm to millions of Ohms per square with a TCR less than ±100 ppm/□C. Inductance increases with length.

Therefore, to minimize inductance in the termination, signal lines should be kept as short as possible. Furthermore, shorter line lengths decrease the undesirable cross-talk described hereinabove. Stray capacitance should be minimized, since this stray capacitance is frequently variable with temperature due to temperature related variations in ordinary dielectrics.

In the prior art, transmission line terminations were initially constructed using large Cermet resistors which were formed by thick film techniques upon alumina (aluminum oxide) substrates. These components were then mounted into a circuit board in a Single-In-line Package (SIP) format. Later, Ball Grid Array (BGA) packages were developed for integrated circuit packages. In this package, the connection between a printed circuit board and the BGA component is achieved through the use of a number of solder balls. These balls are not limited to placement around the periphery of the device, as was the case in the chip resistors of the prior art, but instead the BGA has terminations distributed in the array across the entire package resulting in a higher packaging density. Examples of BGA type terminations are found in U.S. Pat. No. 4,332,341 to Minetti; U.S. Pat. No. 4,945,399 to Brown et al; U.S. Pat. No. 5,539,186 to Abrami et al; U.S. Pat. No. 5,557,502 to Banerjee et al; U.S. Pat. No. 5,661,450 to Davidson; U.S. Pat. No. 6,097,277 to Ginn; U.S. Pat. No. 6,326,677 to Bloom; U.S. Pat. No. 6,005,777 to Bloom; U.S. Pat. No. 5,977,863 to Bloom; U.S. Pat. No. 6,246,312 to Poole and U.S. Pat. No. 6,194,979 to Bloom. Each of these patents illustrate various types of BGA components and packages, the contents and teachings which are incorporated herein by reference.

These prior art BGA devices have a high cost of production due to the fact that they are manufactured either one at a time or in small arrays and many manufacturing steps are required.

While the prior art has provided devices suitable as resistor networks, there is a current unmet need for a lower cost resistor network with low inductance that can be fabricated using an efficient manufacturing process.

SUMMARY OF THE INVENTION

It is a feature of the invention to provide a high density resistor network utilizing the benefits of printed circuit board technology and a solder bump or sphere connection.

It is a feature of the invention to provide a resistor network that minimizes connection inductance from the network to a circuit board by keeping connection wiring as short as possible.

It is a feature of the invention to provide an economical solution to transmission line termination at high frequencies.

It is a feature of the invention to provide a resistor network that includes a planar substrate formed of an organic material having a first and second surface. A resistor is located on the first surface. A ball pad is located on the first surface. The ball pad is connected to the resistor. An organic solder mask is located over the first surface. The solder mask has apertures located over the ball pads. A conductive ball is attached to the ball pad. A reflowed solder paste attaches the conductive ball to the ball pad. The reflowed solder paste connects the conductive ball to the ball pad.

It is a feature of the invention to provide a resistor network that includes a planar substrate formed of an organic material having a first and second surface. A resistor is located on the first surface. A ball pad is located on the first surface. The ball pad is connected to the resistor. An organic solder mask is located over the first surface except for the ball pads. A conductive bump is formed on the ball pads by a reflowed solder paste.

It is a feature of the invention to provide a resistor network that includes an metal substrate having an insulative layer thereon. The insulative layer having a first surface. A resistor is located on the first surface. A ball pad is located on the first surface. The ball pad is connected to the resistor. An organic solder mask is located over the first surface except for the ball pads. A conductive bump is formed on the ball pads by a reflowed solder paste.

It is a feature of the invention to provide a method of making a resistor network. The method includes providing a conductive layer and a resistive layer laminated to a first surface of an organic substrate. The resistive layer is located between the organic substrate and the conductive layer. A ball pad is formed from the conductive layer. A resistor is formed from the resistive layer. The first surface is coated with a solder mask except for the pad. A solder paste is screened onto the pad. A solder sphere is placed onto the pad. The solder paste is reflowed such that the solder sphere is joined to the pad.

It is a feature of the invention to provide a method of making a resistor network. The method includes providing a conductive layer laminated to a first surface of an organic substrate. A ball pad is formed from the conductive layer. A resistor is plated onto the ball pad and the substrate. The first surface is coated with a solder mask except for the pad. A solder paste is screened onto the pad. A solder sphere is placed onto the pad. The solder paste is reflowed such that the solder sphere is joined to the pad.

It is noted that the drawings are not to scale.

Like components have been numbered as similarly as possible between drawings to simplify reference purposes.

DETAILED DESCRIPTION
Preferred Embodiment

Figure 1:
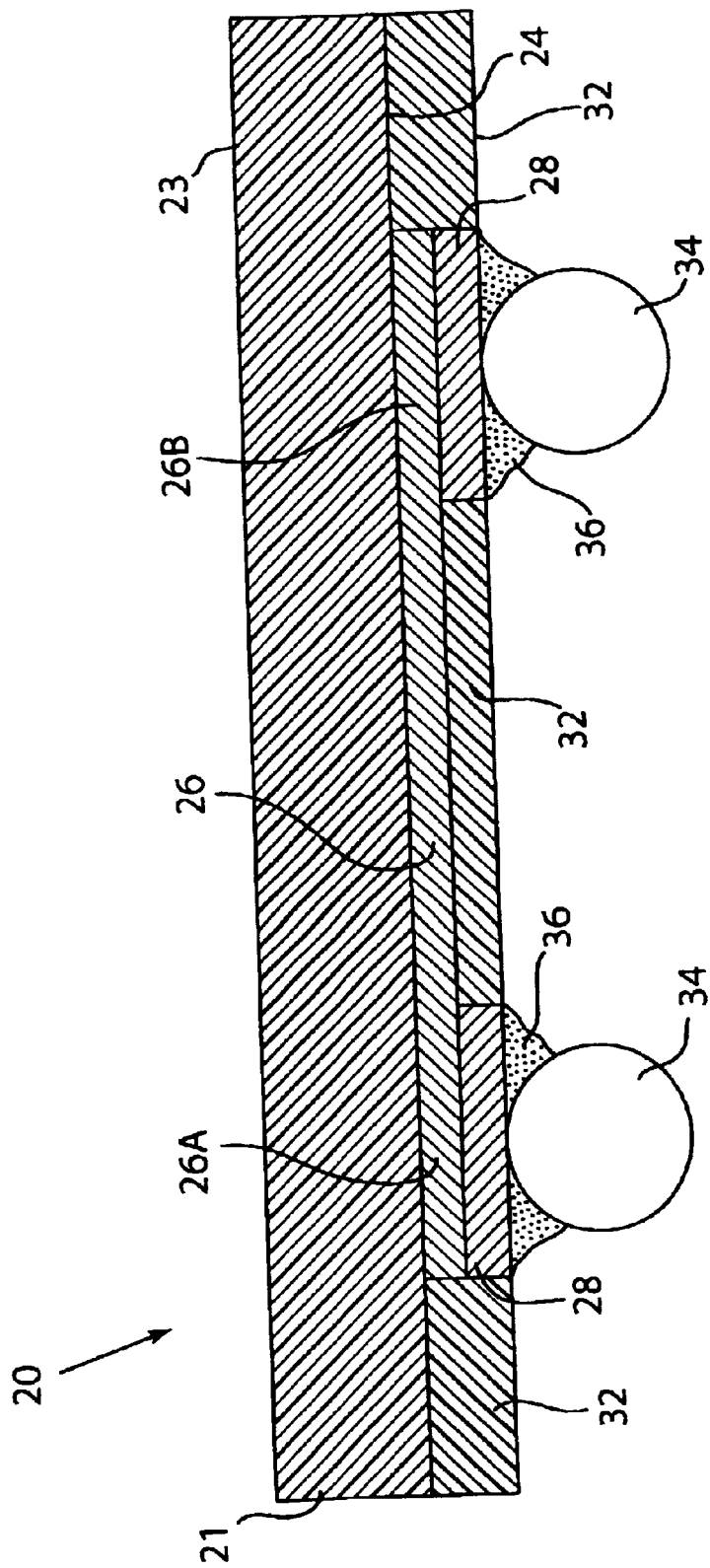
FIG. 1 is a cross-sectional view of a ball grid array resistor network according to the present invention along section line A—A of FIG. 2.
Figure 2:
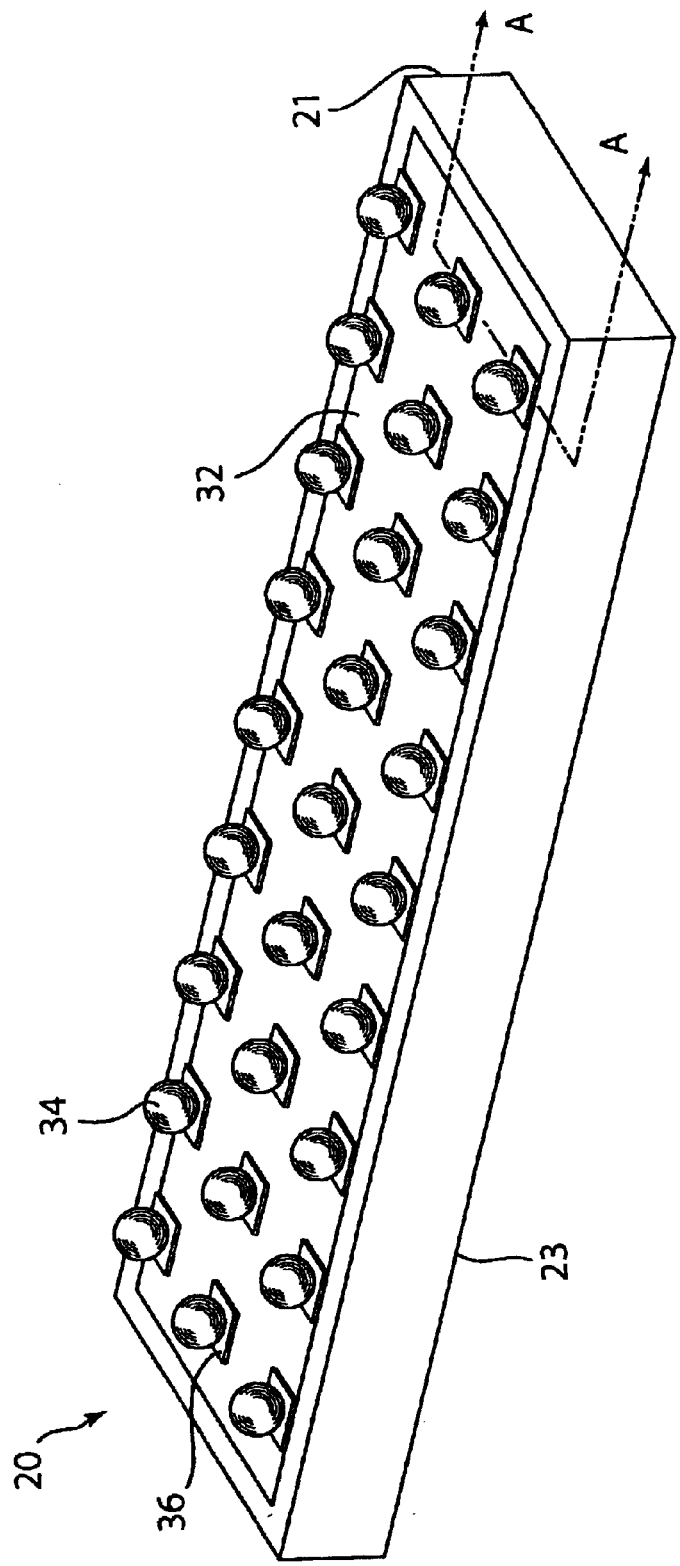
FIG. 2 is a perspective view of the ball grid array resistor network of FIG. 1.

Referring to FIGS. 1 and 2, a Ball Grid Array Resistor Network (BGA) 20 is shown. Network 20 has a planar substrate or printed wiring board 21 formed from an organic polymer material. Substrate 21 has a top surface 23 and a bottom surface 24. Substrate 21 can be formed from various organic materials such as FR4, Polyimide and other insulative dielectrics.

Printed wiring board 21 includes a non-conductive substrate and copper traces. The non-conductive substrate is preferably a composite material, for example, epoxy-glass, phenolic-paper, or polyester-glass; and typical composites used in circuit board manufacturing include polyimides for flexible circuitry or high-temperature applications; paper/phenolic which can be readily punched: National Electrical Manufacturers Association (NEMA) grade FR-2; paper/epoxy which has better mechanical properties than the paper/phenolic: NEMA grade FR-3; glass/epoxy and woven glass fabric which have good mechanical properties: NEMA grade FR-4, FR-5; and random glass/polyester which is suitable for some applications: NEMA grade FR-6. NEMA FR-4 material is preferred.

The glass/epoxy layers are bonded together using adhesive layers, which are conventionally called "prepreg" because they are partially cured before lamination. For a discussion of wiring board fabrication methods, including lamination techniques, see, Shaw, Sam R. and Alonzo S. Martinez Jr. "Rigid And Flexible Printed Wiring Boards And Microvia Technology" in Harper, Charles A., Ed. *Electronic Packaging And Interconnection Handbook*, 3rd Ed., Chapter 11, McGraw-Hill, New York, N.Y. (2000), the relevant portions of which are herein incorporated by reference.

Substrate 21 typically would have dimensions of 0.16 inches by 0.6 inches. A low temperature resistor 26 is attached to substrate 21. Resistor 26 has ends 26A and 26B. Copper ball pads 28 are located over resistor ends 26A and 26B. Resistor 26 is electrically connected to ball pads 28. Resistor 26 can be formed from several different materials using different process. For example, resistor 26 can be a vacuum deposited thin film of nickel chromium or nickel chromium aluminum silicide. Resistor 26 can also be made of doped platinum that is formed by chemical vapor deposition. The thin film would have a typical thickness of 100 to 1000 angstroms. Resistors 26 would have a typical sheet resistance of 50 to 5000 ohms per square. The term low temperature resistor refers to the fact that the resistor is not processed at high temperature of 900 Celsius as is required of thick film cermet resistors. This allows the use of an organic substrate such as a printed circuit board. The resistor 26 can be laser trimmed in order to improve the accuracy of their resistance value. The dimensions of resistor 26 are on the order of 16 mils by 9 mils. Ball pads 28 can be formed from a conductor layer such as a ½ ounce copper foil and have a typical thickness of 0.015 mm. It is noted that the resistor layer 26 extends under ball pads 28. If desired, circuit lines (not shown) can be made from the conductor layer. The conductor lines would be connected between the ball pads and the resistor. A solder mask layer 32 is located over all of surface 24 except for ball pads 28. This leaves an aperture in the solder mask surrounding each ball pad. Solder mask layer 32 is screened or sprayed and photodefined on surface 24 and then cured. Solder mask layer 32 prevents shorting during soldering and protects resistor 26. The processing steps for making ball grid array resistor network 20 are detailed below.

Conductive bumps, spheres or balls 34 are attached to ball pads 28. Conductive spheres 34 are preferably made from a high melting point solder having a composition of 10% tin and 90% lead. Conductive bumps 34 can also be a solder paste that is reflowed into a hump or bump shape. The composition of the conductive spheres 34 can range from 80 to 95 percent lead and 5 to 20 percent tin. The conductive spheres 34 are preferably held to ball pads 28 by a low temperature reflowed solder paste 36. The reflowed solder paste has a composition between 30 to 40 percent lead and 60 to 70 percent tin with a preferred composition of 63% tin and 37% lead.

By using a preformed conductor such as the conductive spheres illustrated, it is possible to achieve consistent dimensional control over the components, where a reflowed extension could be more difficult to control during manufacture. So while preforms are preferred, other cost effective methods of forming electrical attachment points to the terminators and networks of the present invention are contemplated and included herein, to the extent such terminations are known or would be obvious to those skilled in the art.

These conductive balls serve to electrically connect the ball pads to a mother board or other printed circuit or carrier substrate. These solder balls may be manufactured to be quite small, substantially only limited by the smallest sizes that may be produced. These balls may, in fact, be measured in thousandths or hundredths of an inch in diameter. Since all of surface 24 is covered by the ball grid array, there is no wasted surface real-estate on the carrier circuit board, such as a mother board, to which this component is attached. In addition, the signals that the ball pads interact with must only pass along a short lead length reducing inductance and cross-talk noise.

Figure 3:
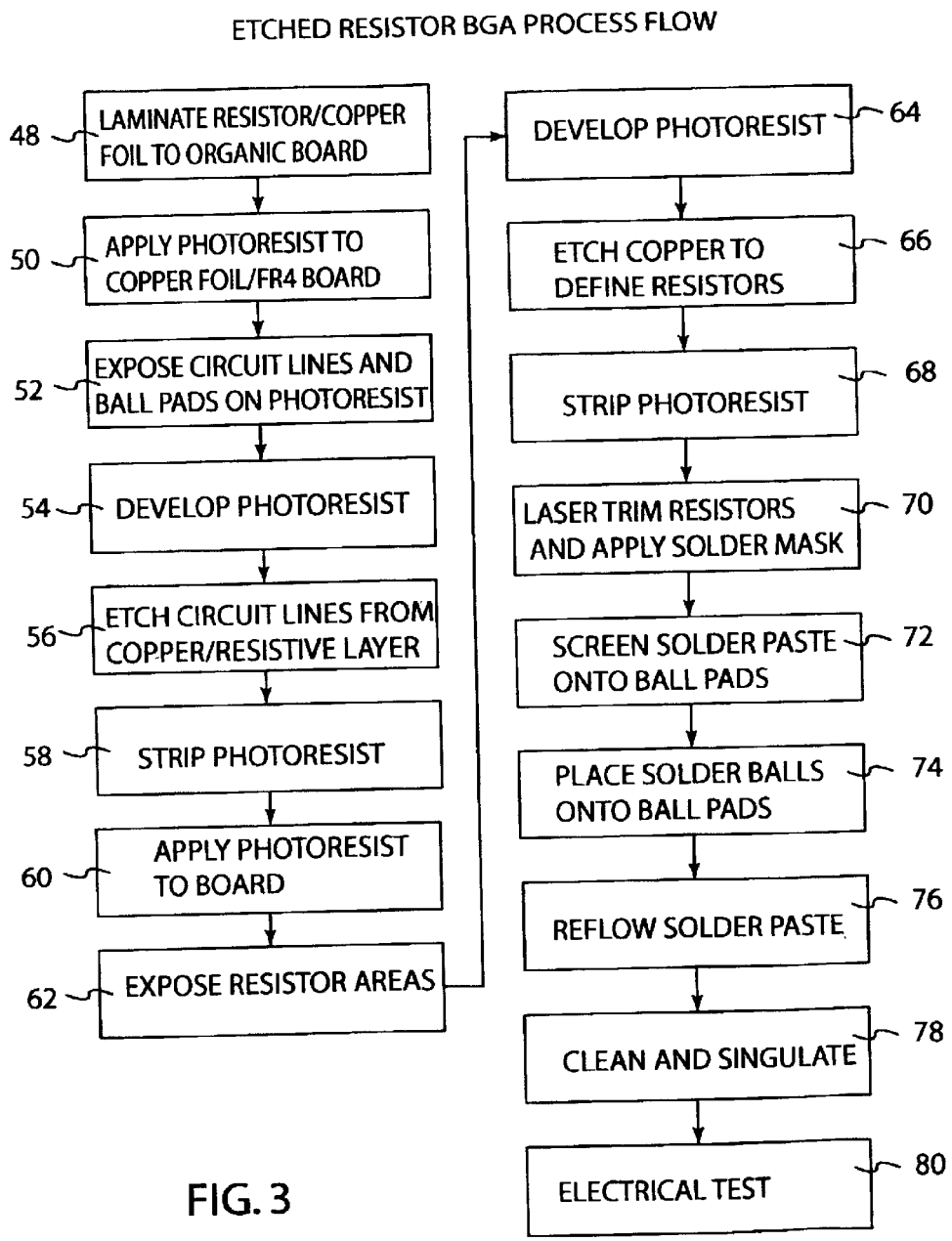
FIG. 3 is a flow chart of the manufacturing steps using an etched resistor for producing the ball grid array resistor network of FIG. 1.

Referring to FIG. 3, a flow chart of the manufacturing steps used for producing ball grid array resistor network 20 is shown. At step 48, an organic substrate is laminated to a conductive layer such as a copper layer or foil that has a thin film resistive layer coated on one side. The resistive layer can be a vacuum deposited thin film of nickel chromium or nickel chromium aluminum silicide. The resistive layer can also be a doped platinum formed by chemical vapor deposition. The copper foil with resistive layer is attached to the substrate using conventional printed circuit board fabrication techniques. Nickel chromium and nickel chromium aluminum silicide thin film coated copper resistive foils are commercially available from Gould Electronics Corporation, Eastlake, Ohio. Doped platinum coated copper foil is commercially available from Shipley Corporation, Marlboro, Mass. The substrate or board used during fabrication has typical overall dimensions of 12 inches by 18 inches or larger. At step 50 a photoresist is applied over the copper layer. The photoresist can be coated or sprayed or can be laminated with a dry film resist. At step 52, the ball pads are exposed in the photoresist. This is done by shining a UV light through a mask that has the desired pattern. At step 54, the photoresist is developed. The ball pads are defined by etching at step 56. The etching process here will be illustrated using a nickel chromium resistor material. Different etch chemicals and processes can be used for different types of resistive films. Substrate 21 is placed into a solution of cupric chloride that removes the exposed copper and resistor layers. Next, at step 58 the photoresist is removed using a photoresist stripper. Photoresist is re-applied to the substrate at step 60, exposed at step 62 to define low temperature resistors 26 and developed at step 64. At step 66, the copper is selectively etched using an ammoniacal etching solution to define the resistors. The photoresist is then stripped off at step 68. The resistor may be laser trimmed to value. Surface 24 is coated with a solder mask at step 70. The solder mask covers all of surface 24 except for the ball pad areas 28. The solder mask protects the resistors and prevents shorts during soldering. The solder mask is preferably P6280C polymer overcoat that is commercially available from Ferro Corporation of Montgomeryville, Pa. The solder mask is screen printed onto surface 24 and then cured at 150 degrees centigrade for 30 minutes.

The substrates are then loaded onto a stainless steel Auer boat for transport through the ball attach machine. The loaded Auer boats are cycled from the input buffer to the elevator. The parts are then captured and lifted to present them to the bottom side of the solder screening station. At step 72, a low melting point solder paste is screened onto ball pads 28. The solder paste has a composition between 30 to 40 percent lead and 60 to 70 percent tin with a preferred composition of 63% tin and 37% lead which melts at 167 degrees centigrade.

Next, at step 74, spheres or balls 34 are placed onto ball pads 28. Conductive spheres 34 are preferably made from a high melting point solder having a composition of 10% tin and 90% lead. The balls are placed using a ball placer, which incorporates a precision machined ball mask to locate and hold the solder balls while this assembly is inverted over the substrates with the solder paste. Once the ball mask is in position the solder balls are released into the solder paste. The ball attach machine then uses a vision system to inspect the pre-reflow condition of the solder balls before the Auer boat with the assembled units is allowed to proceed through the solder reflow and wash portions of the ball attach cell.

At step 76, substrate 21 is placed into an oven where the solder paste 36 is reflowed which attaches solder ball 34 to ball pad 28. Substrate 21 is cleaned and singulated or cut into individual pieces at step 78. A diamond saw, laser or water jet can be used to cut the individual BGA networks. The individual parts are electrically tested at step 80.

Alternatively, placing the solder spheres can be omitted and the solder paste reflowed into a conductive bump or hump shape.

BGA network 20 has many advantages. Network 20 provides a resistor that can be used to terminate transmission lines and other electronic devices that require a matched termination that minimizes reflections and has low inductance. Since, BGA resistor network 20 is fabricated in a large panel of 12×18 inches or larger and then cutup into individual networks 20, the process is very cost efficient. Large numbers of networks and resistors can be fabricated. Each 18×20 printed circuit board panel can contain over 37,000 resistors and 1300 networks. Since, network 20 can be fabricated in a large panel format, the individual cost of each BGA resistor network 20 can be kept low. Another advantage of BGA resistor network 20 is that since substrate 21 is formed from the same material (FR4) as the printed circuit board that it is mounted to, stress to the solder joints from thermal mis-match is eliminated. Both the underlying printed circuit board and substrate 21 will expand and contract at the same rate during temperature changes in the surrounding environment. Since, the expansion rates are matched, the ball pads and solder balls can have smaller dimensions without causing excessive stress in the reflowed solder paste during thermal excursions.

1$^{st}$ Alternative Embodiment

Figure 4:
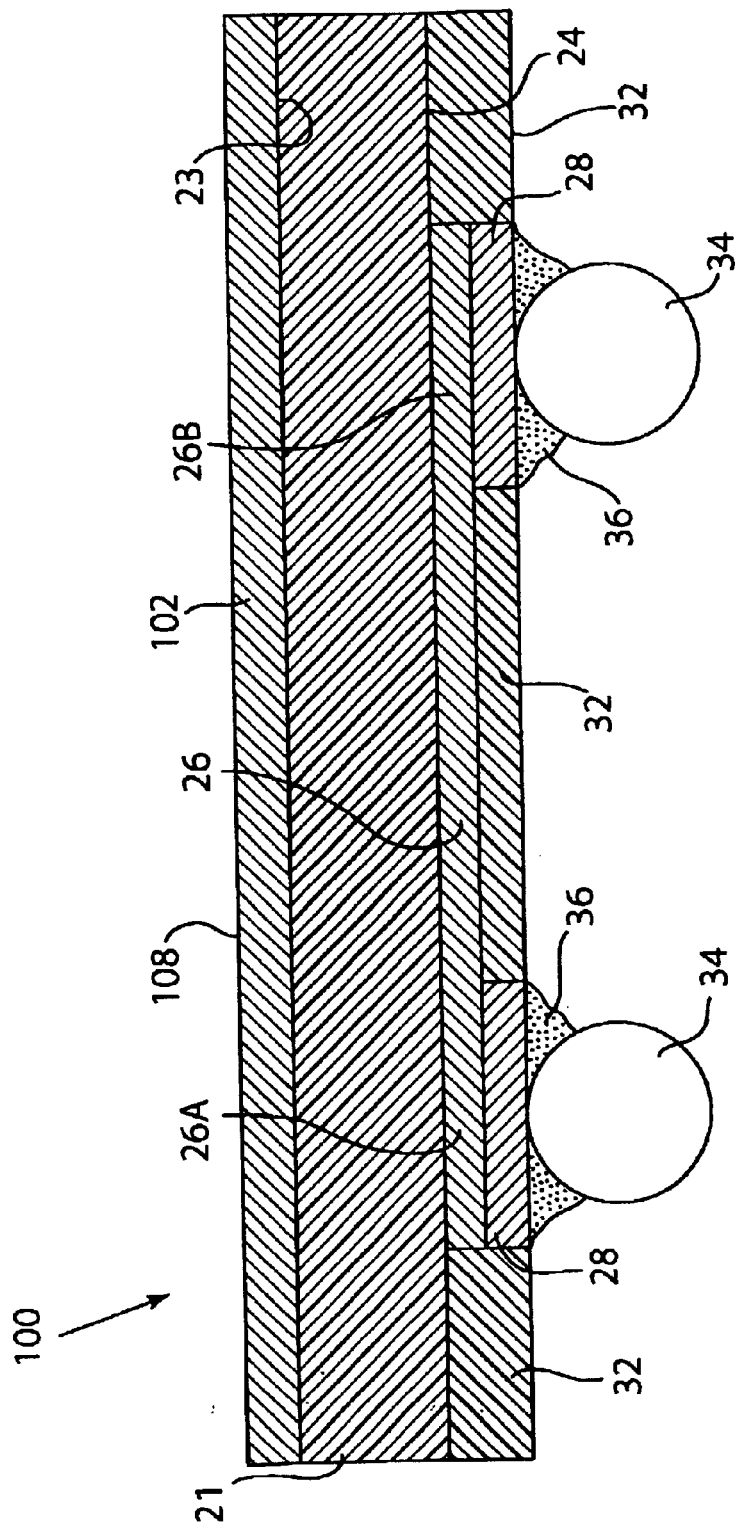
FIG. 4 is a cross-sectional view of an alternative embodiment of a ball grid array resistor network.

Referring to FIG. 4, another embodiment of a Ball Grid Array Resistor Network 100 is shown. Network 100 is similar to network 20 except that a heat dissipating metal layer 102 has been attached to surface 23. Layer 102 has an outer surface 108. Metal layer 102 can be copper or aluminum or any other heat dissipating metal of varying thickness. Metal layer 102 can be another layer of copper foil. If desired more than one layer of heat dissipating metal can be used to form a multi-layered structure. Substrate 21 can be FR4 or Polyimide or another polymeric laminate. For improved thermal performance, substrate 21 can be formed from a thermally conductive material such as Thermal Clad LT or HT dielectric which is commercially available from Bergquist Corporation of Chahassen, Minn. These thermally conductive materials are formed from metal oxide filled epoxies. The thermally conductive material conducts heat generated by resistor 26 through substrate 21 to be dissipated by metal layer 102. The thermally conductive material has a thermal conductivity of 2.2 W/m degree K (watts per meter degree Kelvin). The thermal impedance of this dielectric is 0.45 degrees C./watt at 3 mils thickness. Bergquist Corporation also has CML material that has a thermal conductivity of 1.1 W/m*K and a thermal impedance of 1.1 C/W at 6 mils thickness. As a comparison, the thermal conductivity of conventional FR4 material is ⅒ that of the Bergquist HT material.

The manufacturing processing of network 100 is similar to that of network 20 except that a photoresist would be applied over surface 108 in order to prevent the chemicals used during etching from removing or degrading layer 102.

2$^{nd}$ Alternative Embodiment

Figure 5:
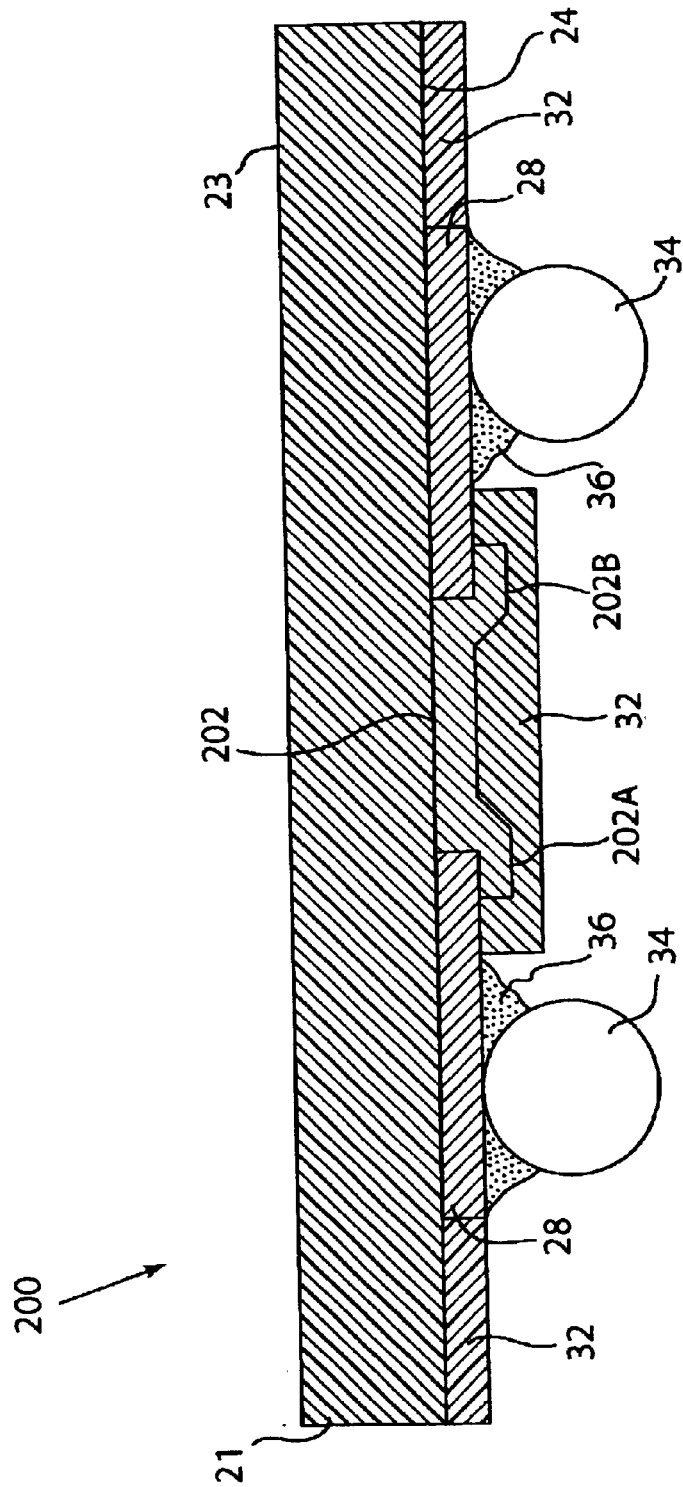
FIG. 5 is a cross-sectional view of an another embodiment of a ball grid array resistor network.

Referring to FIG. 5, another embodiment of a Ball Grid Array Resistor Network 200 is shown. Network 200 is similar to network 20 except that resistor 26 has been replaced by a low temperature additive plated resistor 202. Resistor 202 has ends 202A and 202B that overlap ball pads 28. Resistors 202 have a sheet resistivity of 25 to 250 ohms per square. The middle portion of resistor 202 is attached to substrate 21. Resistor 202 can be additively plated using plating baths commercially available from Macdermid Corporation of Waterbury, Conn. Details of the design and manufacture of such resistors 202 are shown in U.S. Pat. No. 6,281,090. The contents of which are herein incorporated by reference. Resistor 202 can be formed from an electrolessly deposited nickel phosphorous material. Resistor 202 would have typical dimensions of 16 mils by 9 mils. The plated resistor 202 has a thickness of 50–1000 angstroms. If desired, the metal layer 202 of FIG. 2 may be attached to surface 23 of network 200 in order to improve thermal performance.

Figure 6:
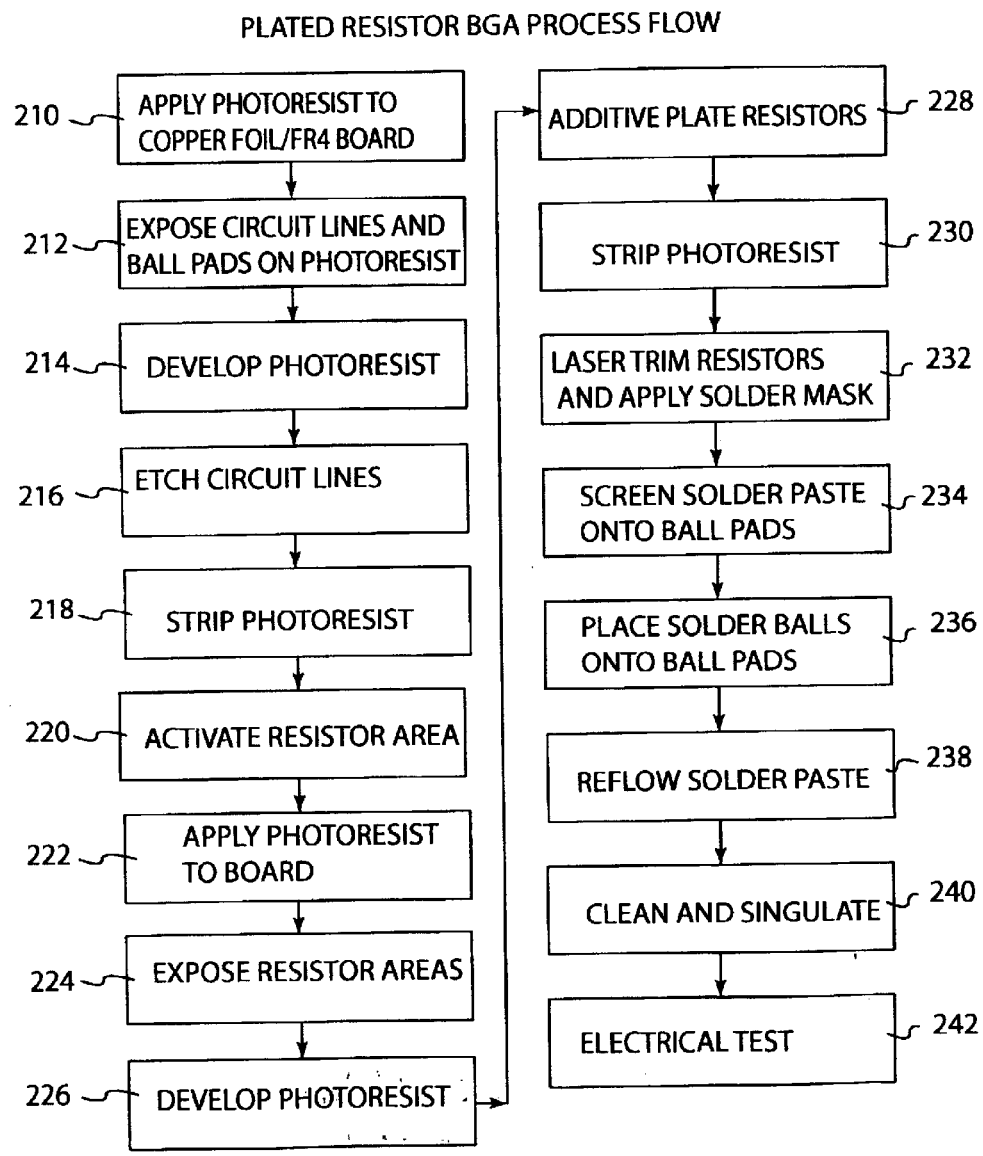
FIG. 6 is a flow chart of the manufacturing steps using a plated resistor for producing the ball grid array resistor network of FIG. 5.

Referring to FIG. 6, a flow chart of the manufacturing steps used for producing ball grid array resistor network 200 are shown. At step 210, a photoresist is applied over a conventional FR4 copper foil/fiberglass printed circuit board. The photoresist can be sprayed or can be a dry film resist. The substrate or board has typical dimensions of 12 inches by 18 inches. At step 212, resistor areas and ball pads are exposed in the photoresist. This is done by shining a UV light through a mask that has the desired pattern. At step 214, the photoresist is developed. The ball pads are etched at step 216. Substrate 21 is placed into a solution of cupric chloride that removes the exposed copper areas. Next, at step 218 the photoresist is removed using a photoresist stripper. At step 220, the substrate 21 surface is activated for plating by dipping the board into an activation bath such as palladium chloride. Photoresist is re-applied to the substrate at step 222 and exposed at step 224 to define areas for resistors 202. At step 226, the photoresist is developed. The resistors are plated at step 228 using an electroless nickel phosphorous bath. Such baths are commercially available from Macdermid Corporation of Waterbury, Conn. Details of the design and manufacture of such resistors are shown in U.S. Pat. No.

6,281,090. The contents of which are herein incorporated by reference in entirety. The plated resistor 202 has a typical thickness of 50 to 1000 angstroms. The photoresist is then stripped off at step 230. The resistor is laser trimmed to value at step 232. Surface 24 is also coated with a solder mask at step 232. The solder mask covers all of surface 24 except for the ball pad areas 28. The solder mask protects the resistors and prevents shorts during soldering. At step 234, a low melting point solder paste is screened onto ball pads 28. The solder paste has a composition between 30 to 40 percent lead and 60 to 70 percent tin with a preferred composition of 63% tin and 37% lead which melts at 167 degrees centigrade. Next, at step 236, conductive bumps, spheres or balls 34 are placed onto ball pads 28. Conductive spheres 34 are preferably made from a high melting point solder having a composition of 10% tin and 90% lead. Alternatively, placing the solder spheres can be omitted and the solder paste reflowed into a conductive bump or hump shape. At step 238, substrate 21 is placed into an oven where the solder paste 36 is reflowed which attaches solder ball 34 to ball pad 28. Substrate 21 is cleaned and singulated or cut into individual pieces at step 240. The individual parts are tested at step 242.

BGA network 200 has the same advantages as network 20.

3$^{rd}$ Alternative Embodiment

Figure 7:
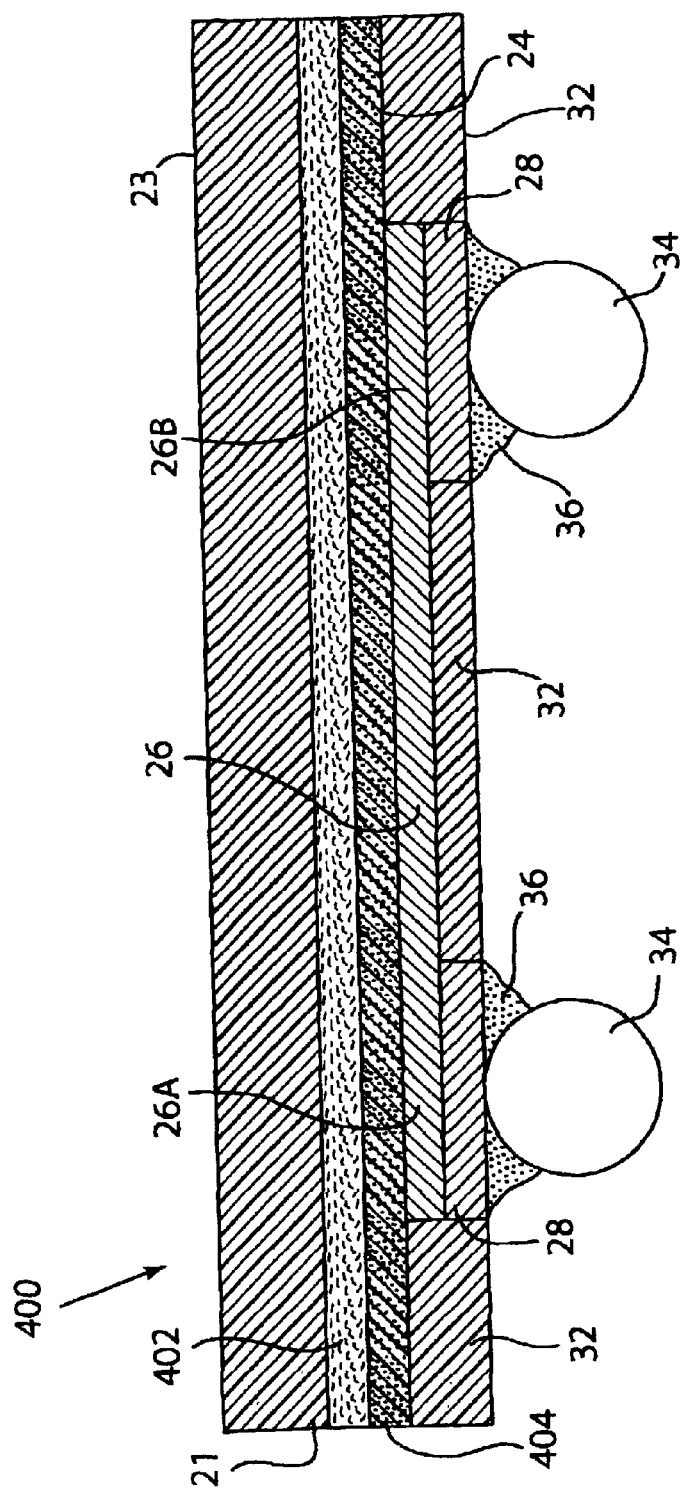
FIG. 7 is a cross-sectional view of an another embodiment of a ball grid array resistor network.

Referring to FIG. 7, another embodiment of a Ball Grid Array Resistor Network 400 is shown. Network 400 has a planar substrate 21 formed from an organic material. Substrate 21 has a top surface 23 and a bottom surface 24. Substrate 21 can be formed from various organic materials such as FR4, Polyimide and other insulative dielectrics. An adhesive layer 402 is attached to substrate 21.

A resistor 26 has ends 26A and 26B. Copper ball pads 28 are located over resistor ends 26A and 26B. Resistor 26 is electrically connected to ball pads 28. Resistor 26 is formed by screen printing a resistive paste onto a copper foil, then firing in an oven. This resistor paste has a resistivity of 10 to 100,000 ohms per square. The resistors would have typical dimensions of 15 mils by 15 mils by 2 to 20 microns thick. The copper foil can be ½ to 10 ounce copper foil. The copper foil is later etched to form copper pads 28. The resistor 26 can be laser trimmed in order to improve the accuracy of their resistance value. A laser reflective layer 404 is placed over the resistor 26. Reflective layer 404 can be a silver filled epoxy resin. The purpose of reflective layer 404 is to prevent the laser used during laser trimming from burning the substrate 21. The laser reflective layer 404 is attached to the adhesive 402. A solder mask layer 32 is located over all of surface 24 except for ball pads 28. Solder mask layer 32 is screened or sprayed on surface 24 and then cured. Solder mask layer 32 prevents shorting during soldering and protects resistor 26.

Conductive bumps, spheres or balls 34 are attached to ball pads 28. Conductive spheres 34 are preferably made from a high melting point solder having a composition of 10% tin and 90% lead. Conductive bumps 34 can also be a solder paste that is reflowed into a hump or bump shape. The composition of the conductive spheres 34 can range from 80 to 95 percent lead and 5 to 20 percent tin. The conductive spheres 34 are preferably held to ball pads 28 by a low temperature reflowed solder paste 36. The reflowed solder paste has a composition between 30 to 40 percent lead and 60 to 70 percent tin with a preferred composition of 63% tin and 37% lead. If desired, the metal layer 202 of FIG. 2 may be attached to surface 23 of network 400 in order to improve thermal performance.

Figure 8:
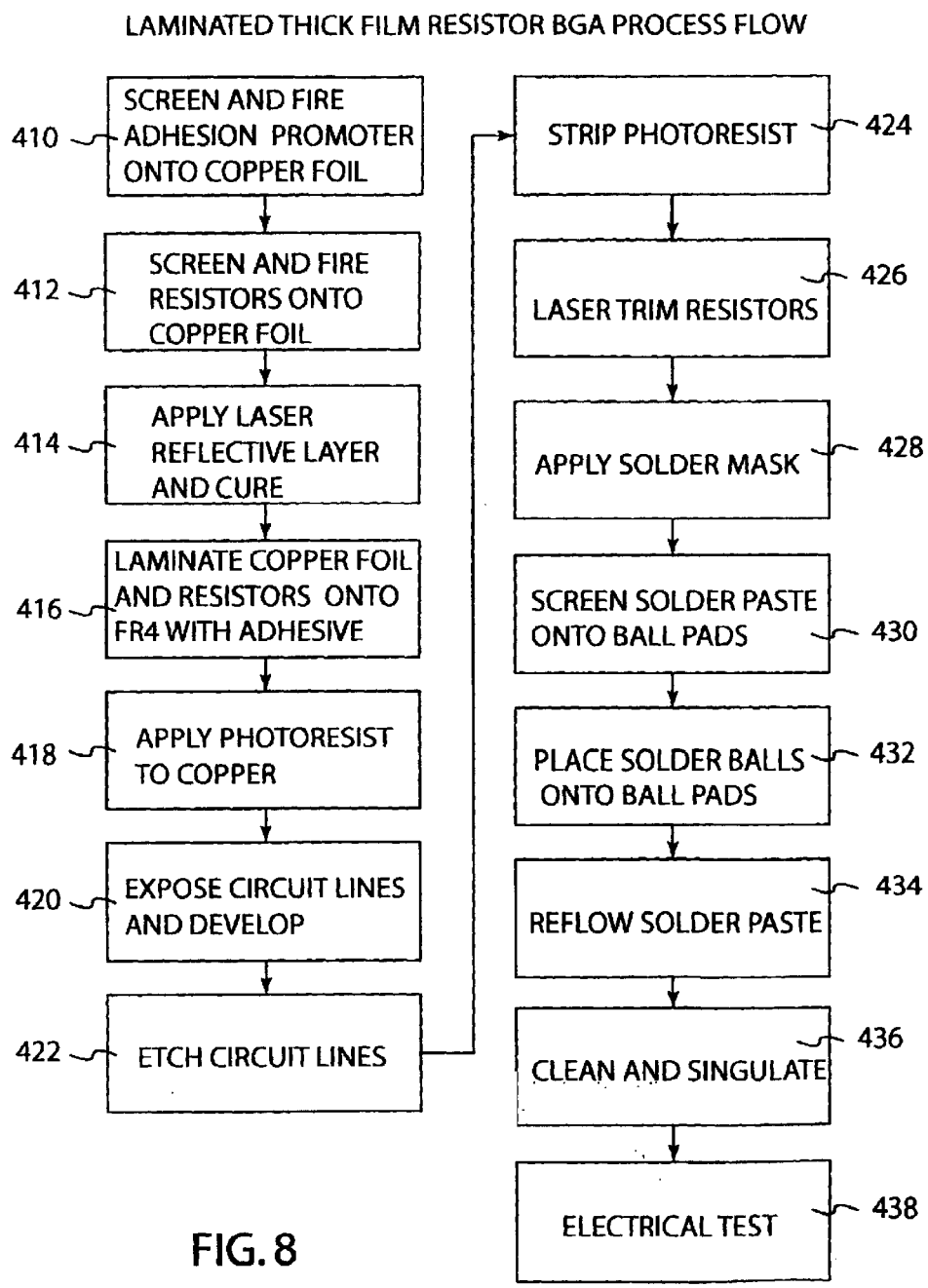
FIG. 8 is a flow chart of the manufacturing steps using a laminated thick film resistor for producing the ball grid array resistor network of FIG. 7.

Referring to FIG. 8, a flow chart of the manufacturing steps used for producing ball grid array resistor network 400 are shown. At step 410, an adhesion promoter (not shown) is screen printed onto a sheet of copper foil and fired at 900 degrees centigrade in a reducing atmosphere furnace. The furnace would typically contain 200 ppm of hydrogen to prevent the copper from oxidizing. The adhesion promoter is a mixture of finely divided copper and glass particles. The adhesion promoter increases the adhesion of the resistor to the copper foil. Next, at step 412, a resistor paste is screen printed onto the adhesion promoter and fired in a reducing atmosphere furnace to form resistor 26. The resistor paste can be a Lanthanum Boride that is commercially available from Dupont Corporation of Wilmington, Del. Details of the design and manufacture of such resistors are shown in U.S. Pat. Nos. 6,317,023 and 4,655,965. The contents of which are herein incorporated by reference in entirety. The resistor can also be formed from a mixture of glass frit and Tin Oxide. At step 414, a laser reflective layer 404 is screen printed onto the resistors and copper foil and cured. Laser reflective layer 404 is a titanium dioxide filled epoxy resin. The purpose of reflective layer 404 is to prevent the laser used during laser trimming from burning completely through substrate 21. At step 416, the copper foil with resistors and laser reflective layer are laminated onto the FR4 substrate 21 with an adhesive 402. Adhesive 402 can be a prepreg layer such as an epoxy resin or can be an acrylic. Examples of some commercially available adhesives are Vialux and Pyralux from Dupont Corporation of Wilmington, Del. A photoresist is applied over the copper foil and resistors at step 418. The photoresist can be sprayed or can be a dry film resist. At step 420, the circuit lines and ball pads are exposed in the photoresist and developed. This is done by shining a UV light through a mask that has the desired pattern. The circuit lines and ball pads are etched at step 422. Substrate 21 is placed into a solution cupric chloride that removes the exposed copper areas. Next, at step 424 the photoresist is removed using a photoresist stripper. At step 426, resistor 26 is laser trimmed to value. The resistors 26 and exposed layer 404 are coated with a solder mask at step 428. The solder mask protects the resistors and prevents shorts during soldering. At step 430, a low melting point solder paste is screened onto ball pads 28. The solder paste has a composition between 30 to 40 percent lead and 60 to 70 percent tin with a preferred composition of 63% tin and 37% lead which melts at 167 degrees centigrade. Next, at step 432, conductive bumps, spheres or balls 34 are placed onto ball pads 28. Conductive spheres 34 are preferably made from a high melting point solder having a composition of 10% tin and 90% lead. Alternatively, placing the solder spheres can be omitted and the solder paste reflowed into a conductive bump or hump shape. At step 434, substrate 21 is placed into an oven where the solder paste 36 is reflowed which attaches solder ball 34 to ball pad 28. BGA network 400 is cleaned and singulated or cut into individual pieces at step 436. The individual parts are electrically tested at step 438.

Analysis of Electrical Performance

Figure 9:
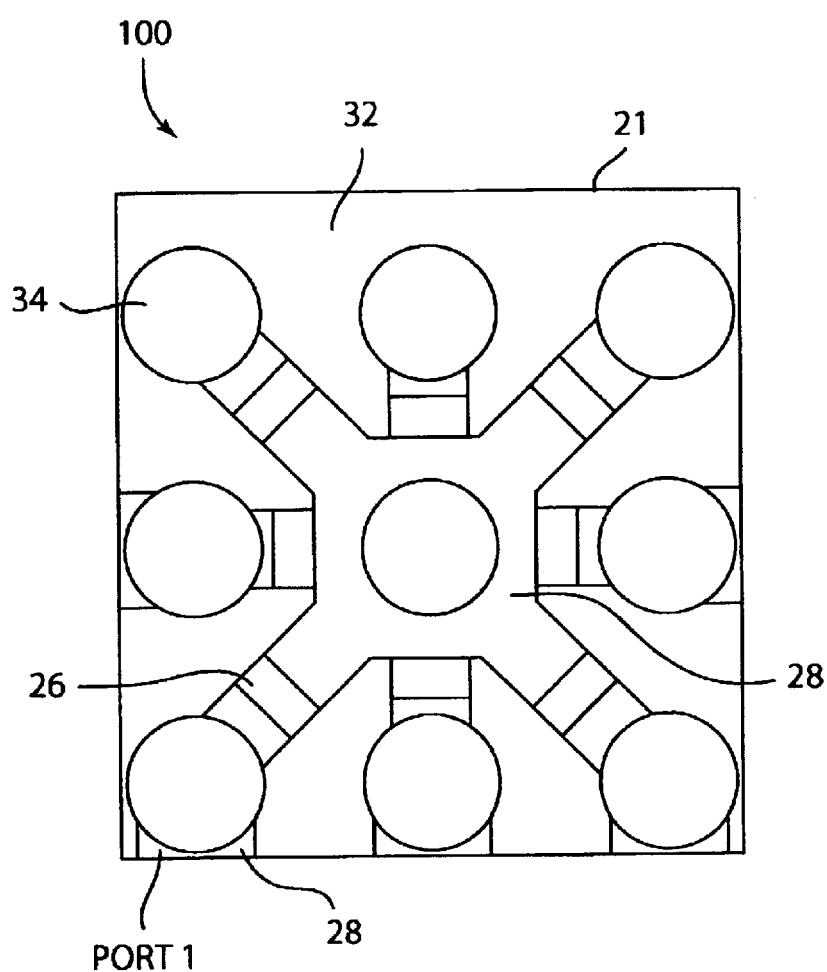
FIG. 9 is a bottom view of a ball grid array resistor network used for a computer circuit simulation.

A circuit analysis simulation was performed using BGA resistor network 100 of the present invention. FIG. 9 shows a bottom view of the resistor, ball pads and solder sphere layout that was used in the simulation.

The substrate 21 used an FR4 material with a dielectric constant of 4 and a loss tangent of 0.02. The substrate has a thickness of 3 mils. The ball pad conductivity was 47000000 s/m at 0.7 mil thickness. The resistor material is 100 ohm/square at 500 angstroms thickness. The port characteristic impedance was set at 50 Ω. Metal layer 102 is floating and not grounded.

Agilent Momentum Simulation Software was used for the resistor network simulation. S parameters were obtained through the simulation. The S parameters were converted into Z and Y matrices to obtain the resistor value and parasitic inductance and coupling capacitance. The parasitic parameter of two adjacent resistors was estimated as a two port network.

The following table shows the resistor inductance is significantly reduced with the presence of top conductive layer 102. It is believed that the self capacitance between the resistor and metal layer 102 cancels with the self inductance of the resistor giving a lower inductance value.

|  | parasitic inductance* | coupling capacitance* |
|---|---|---|
| Port1 resistor with top conductive layer | 0.727 nH | 0.23 pF |
| Port1 resistor without top conductive layer | 1.595 nH | 0.18 pF |

*parasitic parameters @ 2 GHz.

Figure 11:
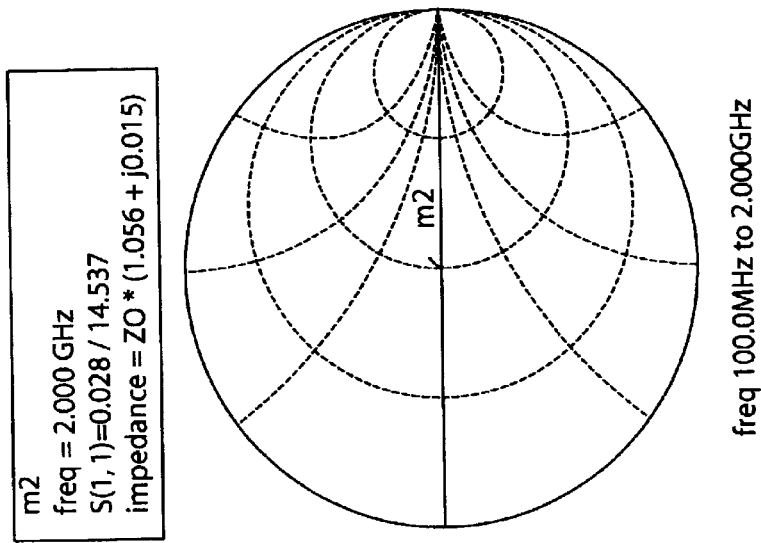
FIG. 11 is a Smith chart plot of S11 for the resistor network of FIG. 9 with metal layer 102.
Figure 10:
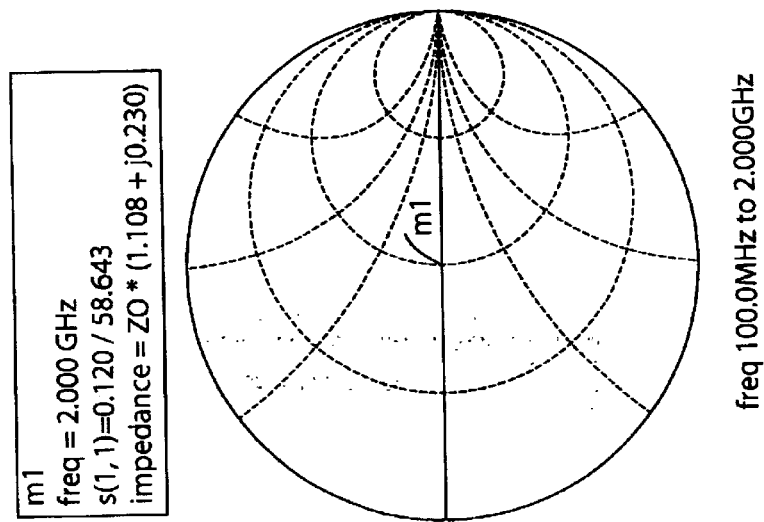
FIG. 10 is a Smith chart plot of S11 for the resistor network of FIG. 9 without metal layer 102.

Referring to FIGS. 10 and 11, a smith chart of the simulation is shown. FIG. 10 shows S11 without the top metal layer 102 and FIG. 11 shows S11 with metal layer 102. As can be seen, the resistor inductance is significantly reduced with the top conductive layer 102. Metal layer 102 does not affect coupling capacitance significantly between the resistors.

By manipulating various parameters of the resistor network design, the inductance values of the resistors can be minimized. For example, the substrate thickness and dielectric constant can be adjusted to help reduce the inductance. Changing the dimensions and thickness of the ball pads and resistors also influences the inductance.

Variations of the Invention

While the figures illustrate possible constructions of the invention, variations are certainly possible. One possible variation is to place resistors onto surface 23 and use a plated through hole (PTH) to provide an electrical connection to solder sphere 34. It is also apparent that many different numbers of resistors may be used in accord with the present teachings for any given application, and particular numbers of components may lend special significance to only one or a few of the preferred specific applications. Several different resistor material systems were shown. Other resistor material systems could also be used in conjunction with the present invention. For example, a polymer thick film resistor system could be used. While the invention was directed to a resistor termination network, it is contemplated that the invention could be directed to other applications. For example, the BGA resistor network could be used as a fuse array or could be combined with inductors or capacitors to form a filter array. The BGA resistor network could further be fabricated with a PTC resistor material to form a resetable fuse.

While the foregoing details what is felt to be the preferred embodiment of the invention, no material limitations to the scope of the claimed invention are intended. Further, features and design alternatives that would be obvious to one of ordinary skill in the art upon a reading of the present disclosure are considered to be incorporated herein. The scope of the invention is set forth and particularly described in the claims hereinbelow.

We claim:

1. A resistor network comprising:
   a) a planar substrate formed of a polymeric material having a first and second surface;
   b) a metal layer attached to the second surface;
   c) a pair of ball pads located on the first surface;
   a) a resistor located on the first surface between the ball pads;
   b) a solder mask located over the first surface except for the ball pads;
   c) a conductive ball located adjacent to the ball pad;
   d) a reflowed solder paste partially surrounding the conductive ball and the ball pad, the reflowed solder paste connecting the conductive ball to the ball pad; and
   e) the resistor having a self-inductance, a self-capacitance, a first inductance between the resistor and the metal layer and a first capacitance between the resistor and the metal layer, the first capacitance canceling the self-inductance of the resistor such that the overall inductance of the resistor is minimized.

2. The resistor network of claim 1, wherein the metal layer is not connected to ground.

3. The resistor network of claim 1, wherein the substrate has a pre-determined thickness and a pre-determined dielectric constant that are selected to reduce the resistor overall inductance.

4. The resistor network of claim 1, wherein the polymer substrate is selected from the group consisting of:
   a) polyimide;
   b) FR4 glass epoxy; or
   c) a thermally conductive dielectric material.

* * * * *